(12) United States Patent
Kris et al.

(10) Patent No.: US 11,056,404 B1
(45) Date of Patent: Jul. 6, 2021

(54) EVALUATING A HOLE FORMED IN AN INTERMEDIATE PRODUCT

(71) Applicant: APPLIED MATERIALS ISRAEL LTD., Rehovot (IL)

(72) Inventors: Roman Kris, Jerusalem (IL); Grigory Klebanov, Rishon-le-Zion (IL); Dhananjay Singh Rathore, Boise, ID (US); Einat Frishman, Rehovot (IL); Sharon Duvdevani-Bar, Mazkeret-Batya (IL); Assaf Shamir, Tel-Aviv (IL); Elad Sommer, Nes-Harim (IL); Jannelle Anna Geva, Tel-Aviv (IL); Daniel Alan Rogers, Boise, ID (US); Ido Friedler, Haifa (IL); Avi Aviad Ben Simhon, Ashdod (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 69 days.

(21) Appl. No.: 16/719,856

(22) Filed: Dec. 18, 2019

(51) Int. Cl.
  *G06T 7/00* (2017.01)
  *H01L 21/66* (2006.01)

(52) U.S. Cl.
  CPC ............ *H01L 22/12* (2013.01); *G06T 7/0004* (2013.01); *G06T 2207/10061* (2013.01); *G06T 2207/30148* (2013.01)

(58) Field of Classification Search
  CPC ................... H01L 22/12; G06T 7/0004; G06T 2207/10061; G06T 2207/30148
  See application file for complete search history.

(56) References Cited

U.S. PATENT DOCUMENTS

| | | | |
|---|---|---|---|
| 2002/0168849 A1* | 11/2002 | Lee | H01L 21/31144 438/637 |
| 2015/0028204 A1* | 1/2015 | Nojima | H01L 22/12 250/307 |
| 2015/0362524 A1* | 12/2015 | Chirko | H01J 37/28 850/36 |
| 2016/0379798 A1* | 12/2016 | Shishido | H01J 37/244 250/307 |

* cited by examiner

*Primary Examiner* — Carol Wang
(74) *Attorney, Agent, or Firm* — Kilpatrick Townsend & Stockton LLP (57) ABSTRACT

An evaluation system that may include an imager; and a processing circuit. The imager may be configured to obtain an electron image of a hole that is formed by an etch process, the hole exposes at least one layer of a one or more sets of layers, each set of layers comprises layers that differ from each other by their electron yield and belong to an intermediate product. The processing circuit may be configured to evaluate, based on the electron image, whether the hole ended at a target layer of the intermediate product. The intermediate product is manufactured by one or more manufacturing stages of a manufacturing process of a three dimensional NAND memory unit. The hole may exhibit a high aspect ratio, and has a width of a nanometric scale.

17 Claims, 6 Drawing Sheets

Obtaining an electron image of the hole, the hole exposes at least one layer of a one or more sets of layers, each set of layers comprises layers that differ from each other by their electron yield and belong to an intermediate product. The intermediate product is manufactured by one or more manufacturing stages of a manufacturing process of a three dimensional NAND memory unit. The hole exhibits a high aspect ratio, and has a width of nanometric scale 110

Evaluating, by an evaluation system, and based on the electron image, whether the hole ended at a target layer of the intermediate product. 220

Classifying the hole to a class out of different classes that represent different possible outcomes of the etch process 122

Obtaining an electron image of the hole, the hole exposes at least one layer of a one or more sets of layers, each set of layers comprises layers that differ from each other by their electron yield and belong to an intermediate product. The intermediate product is manufactured by one or more manufacturing stages of a manufacturing process of a three dimensional NAND memory unit. The hole exhibits a high aspect ratio, and has a width of nanometric scale 110

Evaluating, by an evaluation system, and based on the electron image, whether the hole ended at a target layer of the intermediate product. 220

Classifying the hole to a class out of different classes that represent different possible outcomes of the etch process 122

EVALUATING A HOLE FORMED IN AN INTERMEDIATE PRODUCT

BACKGROUND OF THE INVENTION

A three dimensional NAND memory unit includes pairs of conductive layers and non-conductive layers. Each pair may be regarded as a set of layers that differ from each other by electron yield. Accordingly, more electrons are expected to be emitted from a conductive layer of a pair of layers in relation to electrons emitted from a non-conductive layer of the pair.

The pairs are arranged in a staircase formation. Each stair includes a single pair. The staircase formation enables to connect each pair to a vertically formed conductor.

Vertically formed conductors are manufactured by applying an etch process to form holes. Following the etch process, the holes are filled with at least one conductive material.

The three dimensional NAND memory unit may be manufactured by a manufacturing process that involves multiple manufacturing stages. The formation of the holes by the etch process is one of the manufacturing stages.

An outcome of each manufacturing stage (except of a final manufacturing stage of the manufacturing process) may be regarded as an intermediate product that is related to the three dimensional NAND memory unit.

The manufacturing stages should be monitored. Failures introduced in one or more manufacturing stages may dramatically reduce the yield of the entire manufacturing process.

For example, a failure in the etch process that forms the holes may reduce the electrical coupling between a conductive layer and a vertically formed conductor. Yet another failure may unwantedly electrically couple one conductive layer to another.

Merely measuring critical dimensions of one or more layers exposed by a hole cannot, by itself, provide a reliable indication about the success of the etch process.

There is a growing need to provide an accurate and efficient manner to evaluate holes formed by an etch process.

BRIEF SUMMARY OF THE INVENTION

There may be provided an evaluation system that may include an imager and a processing circuit. The imager may be configured to obtain an electron image of a hole that is formed by an etch process, the hole exposes at least one layer of a one or more sets of layers, each set of layers comprises layers that differ from each other by their electron yield and belong to an intermediate product. The processing circuit may be configured to evaluate, based on the electron image, whether the hole ended at a target layer of the intermediate product. The intermediate product may be manufactured by one or more manufacturing stages of a manufacturing process of a three dimensional NAND memory unit. The hole may exhibit a high aspect ratio, and has a width of a nanometric scale.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method, and should be applied mutatis mutandis to a computer readable medium that is non-transitory and stores instructions for executing the method.

Any reference in the specification to a system should be applied mutatis mutandis to a method that may be executed by the system, and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

The term "aspect ratio" means a ratio between a depth and a width of an element. A high aspect ratio may be regarded as an aspect ratio that exceeds, for example, 10:1.

The term "nanometric scale" means a value that may range between few tens nanometers and less than one nanometer.

There may be provided a system, a method, and a computer readable media that may reliably detect etch process failures, such as under-etched holes and over-etched holes of various degrees.

Ideally, each hole should reach (and partially penetrate) a target layer which is a conductive layer. The hole should not penetrate one or more layers located below that target layer.

Nevertheless, even when using a state of the art etch process, various etch process errors may occur:
 a. A hole may not reach the target layer (an under-etched hole).
 b. A hole may pass through the entire target layer and penetrate through a part of a non-conductive layer located below the target layer (a first degree over-etched hole).
 c. A hole may penetrate through the entire target layer, through the entire non-conductive layer located below the target layer, and through at least a part of yet another conductive layer located below the target layer (a second degree over-etched hole).

A formation of the second degree over-etched hole is very problematic. When the second degree over-etched hole is filled with a conductive material, the conductive material may electrically couple the target layer and the other conductive layer located below the target layer.

Figure 1:
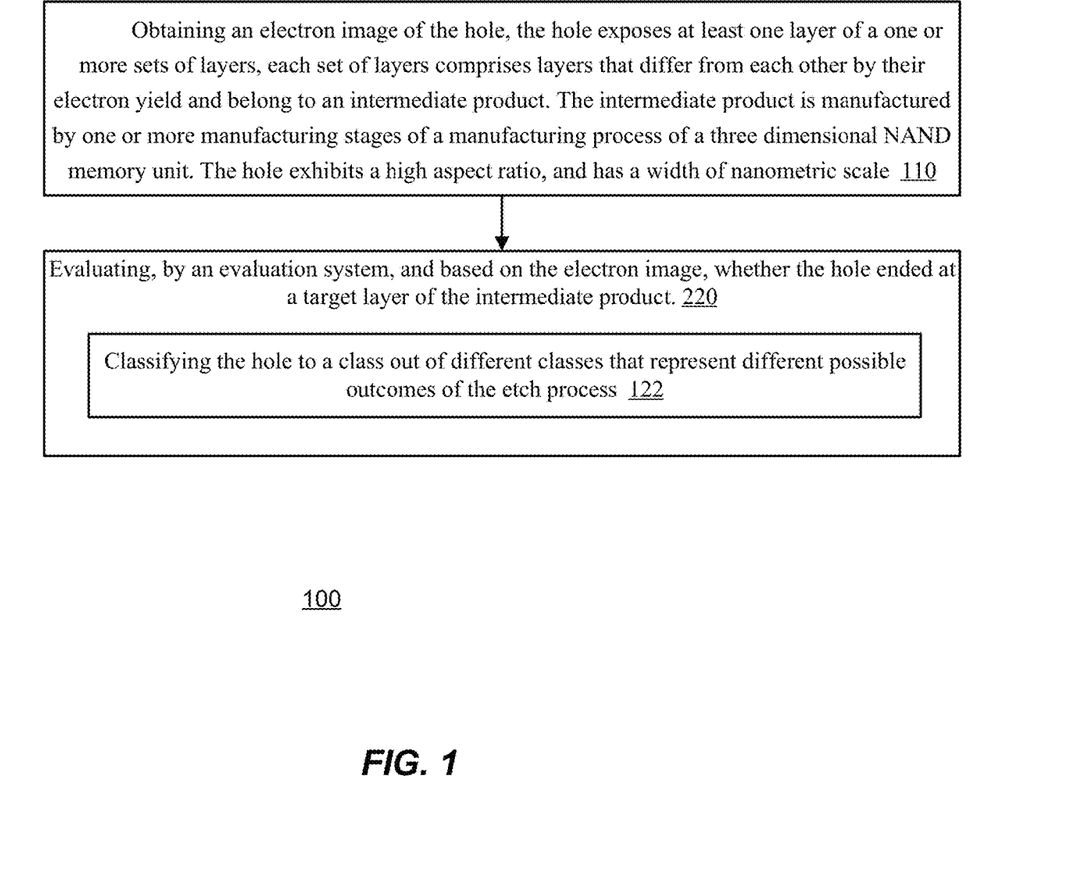
FIG. 1 is an example of a method.

FIG. 1 illustrates an example of a method 100 for evaluating a hole formed by an etch process.

The hole is formed in an intermediate product that is manufactured by one or more manufacturing stages of a manufacturing process of a three dimensional (3D) NAND memory unit. The one or more manufacturing processes may form the staircase structure, and an etching of the holes through at least an upper part of an intermediate product.

Once the manufacturing process is successfully completed a 3D NAND memory unit is formed.

The intermediate product includes multiple sets of layers. In various current 3D NAND memory units each set of layers includes only two layers.

It should be noted that a set of layers may include more than two layers that differ from each other by electron yield, and that any set of layers may include multiple conductivity levels.

The hole exhibits a high aspect ratio, and has a width of nanometric scale.

Method 100 includes step 110 and step 120. Step 120 follows step 120.

Step 110 may include obtaining an electron image of the hole.

The hole exposes at least one layer of one or more sets of layers.

Thus—the holes may expose one layer of a single set of layers, multiple layers of a single set of layers, and even layers from two or more sets of layers.

Step 110 of obtaining may include illuminating the hole with a charged particle beam and detecting electrons emitted from the hole.

An electron image is an image generated by applying an electron image acquisition process that involves (a) illuminating a one or more intermediate products (or one or more portions of the one or more intermediate products, such as one or more holes) with one or more electron beams and (b) detecting electrons emitted due to the illuminating.

Step 110 may be executed by an evaluation system. The evaluation system may be configured to apply the electron image acquisition process.

Alternatively, the evaluation system may receive the electron image without performing the electron image acquisition process.

The electron image acquisition process may also include processing detection signals that represent the detection of the detected electrons.

The processing of the detection signals may include applying at least one out of noise reduction operations, smoothing operations, and/or providing an electron image of a certain format. The certain format may be a gray level format but other formats may be provided.

The detected electrons may be secondary electrons, backscattered electrons, and the like.

The electron image acquisition process may be executed by a scanning electron microscope (SEM), by a critical dimension SEM, by a defect review SEM, by an electron beam images, and the like.

Step 120 may include evaluating, by an evaluation system, and based on the electron image, whether the hole ended at a target layer of the intermediate product.

Step 120 may include step 122 of classifying the hole to a class out of different classes that represent different possible outcomes of the etch process.

The classifying may be based on attributes related to at least a part of the electron image. The at least a part of the electron image may have a radial symmetry.

The attributes may represent image signal properties related to etch process parameters.

The image signal may be, for example, a radial average of gray levels obtained while traversing along a virtual radial line over the electron image of the hole. Thus, at each point along the line, an average gray level of each pixels located at the same radius (same distance from the center of the electron image) may be calculated. Functions other than average may be applied to generate the signal.

The attributes may be related to the image formation conditions corresponding to the layers which are located at the bottom of contact.

Non-limiting examples of attributes of the signal may include, for example, an average of the signal, weighted average of the signal, signal standard deviation, locations of minimal and maximal values of the signal, a normalized values of local minimal and maximums of the signal.

The classes of the hole may include a properly etched hole, an under-etched hole, a first degree over-etched hole, and a second degree over-etched hole. The second degree exceeds the first degree and may represent a punch-through scenario.

A first degree over-etched hole may expose a conductive layer of a single set of layers. A second degree over-etched hole exposes conductive layers of two or more sets of layers.

The classification may be learnt by various manners, for example by performing a training process in which electron images of holes that are labeled as representing different classes of holes are fed to a classifier and/or a machine learning process. The classifier and/or the machine learning process determines the different classes based on the images and the labels.

The classification may be based on the attributes that are related to at least a part of the electron image.

FIGS. 2-5 illustrate examples of a first hole 41, a second hole 42, a third hole 43 and a fourth hole 44 that are formed in a part 11 of an intermediate product.

Part 11 includes first set of layers 31, a second set of layers 32, third set of layers 33, a fourth set of layers 34, a fifth set of layers 35, and a sixth set of layers 36.

The six sets of layers form a staircase structure in which each set of layers is wider than all sets of layers located above the set of layers.

The six sets of layers are covered by a top region 20. The six sets of layers may be covered by multiple regions of various shapes and/or size.

Each set of layers may include a non-conductive layer that is located on top of a conductive layer.

The six sets of layers includes first non-conductive layer 31(1), first conductive layer 31(2), second non-conductive layer 32(1), second conductive layer 32(2), third non-conductive layer 33(1), third conductive layer 33(2), fourth non-conductive layer 34(1), fourth conductive layer 34(2), fifth non-conductive layer 35(1), fifth conductive layer 35(2), sixth non-conductive layer 36(1), and sixth conductive layer 36(2).

The number of sets of layers per intermediate product may differ from six.

For simplicity of explanation, each figure illustrates a single hole that is aimed to a different target region.

Figure 2:
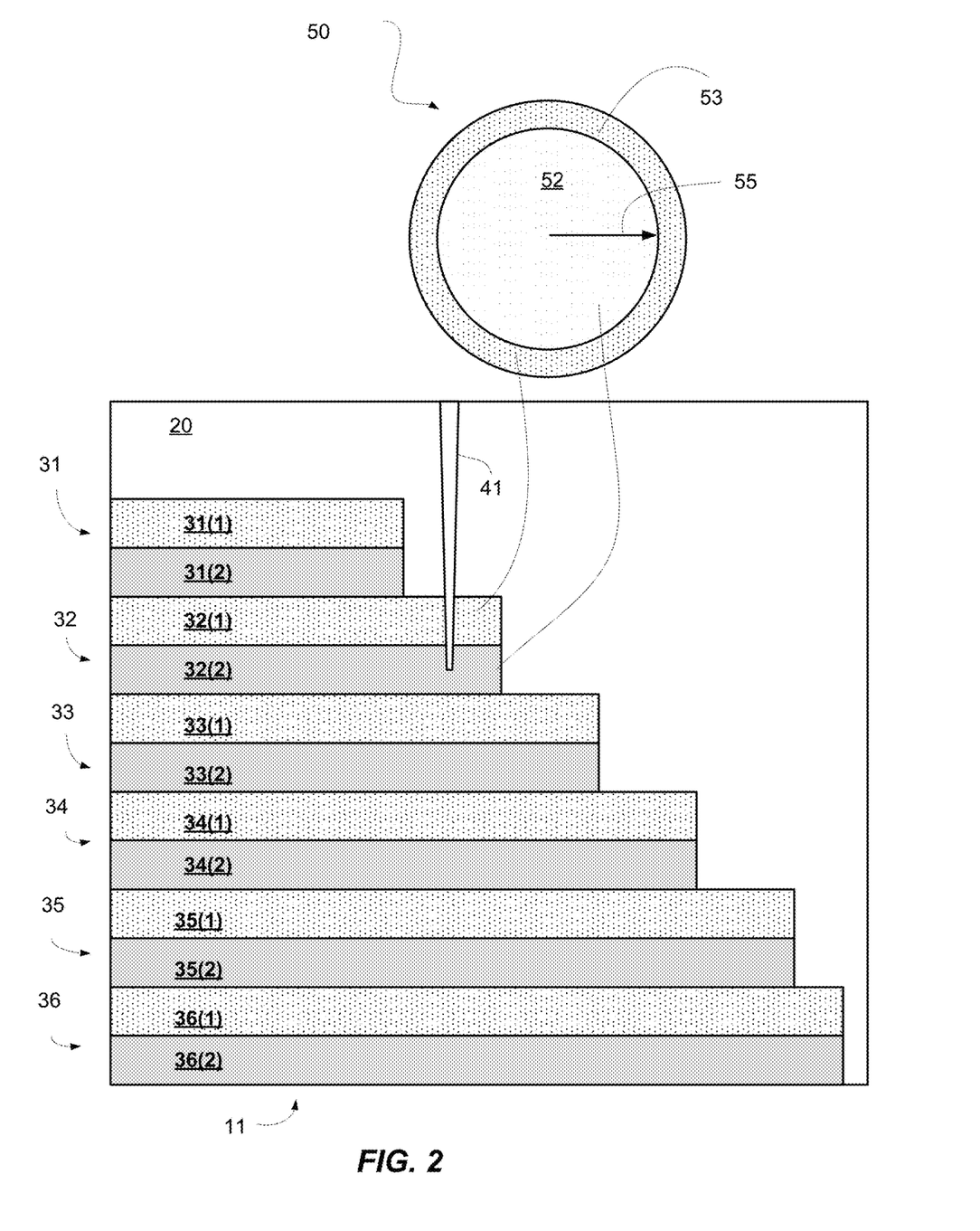
FIG. 2 is an example of a hole formed within a part of an intermediate product.

First hole 41 of FIG. 2 is a proper hole. The first hole 41 exposes (a) second target layer 32(2) which is conductive and belongs to second set of layers 32, and (b) second non-conductive layer 32(1) that is located above the second target layer and also belongs to the second set of layers 32.

Electron image 50 of FIG. 2 includes a center 52 that represents second target layer 32(2), and a peripheral region 53 that represents second non-conductive layer 32(1).

Figure 3:
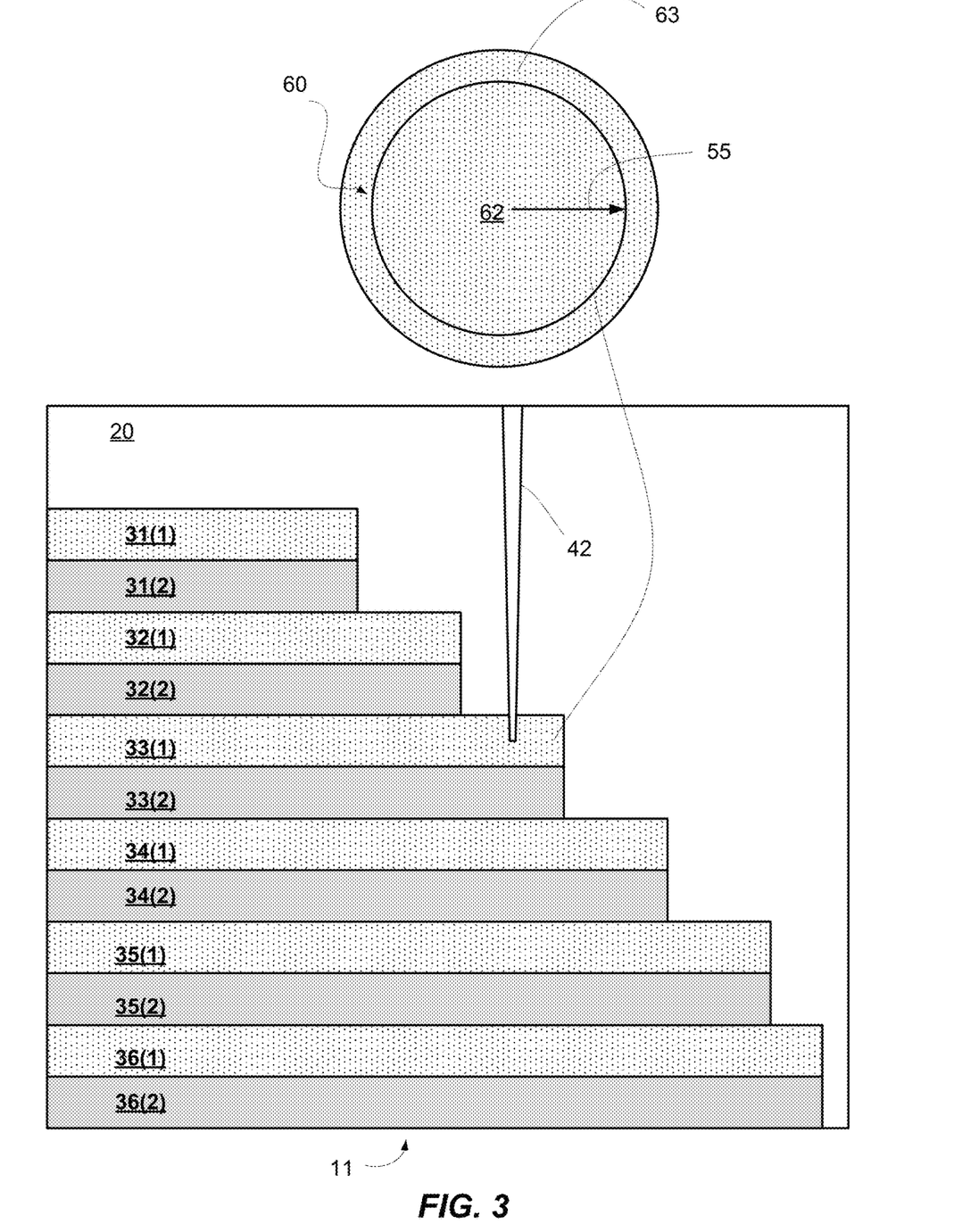
FIG. 3 is an example of a hole formed within a part of an intermediate product.

Second hole 42 of FIG. 3 is an under-etched hole. The second hole 42 does not reach third target layer 33(2) which is conductive and belongs to third set of layers 33. The second hole 42 exposes third non-conductive layer 33(1) that is located above the third target layer 33(2) and also belongs to the third set of layers 33.

Electron image 60 of FIG. 3 includes a center 62 and a peripheral region 63 that represent third non-conductive layer 33(1).

Figure 4:
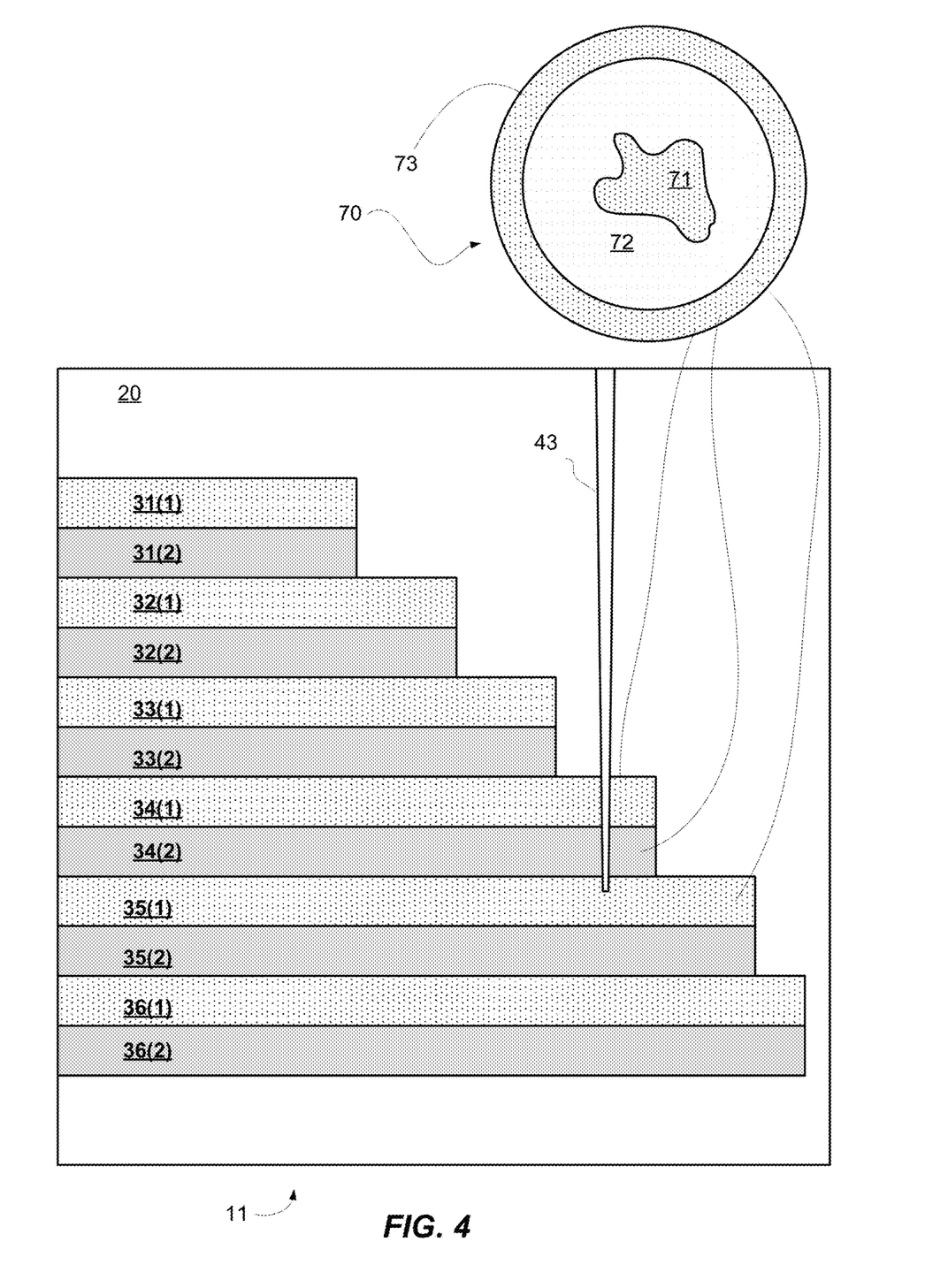
FIG. 4 is an example of a hole formed within a part of an intermediate product.

Third hole 43 of FIG. 4 is a first degree over-etched hole. The third hole 43 exposes (a) fourth non-conductive layer 34(1) that is located above the fourth target layer 34(2) and belongs to the fourth set of layers 34, (b) fourth target layer 34(2) which is conductive, and (c) fifth non-conductive layer 35(1) that is located below the fourth target layer 34(2) and belongs to the fifth set of layers 35. Third hole 43 penetrates through the entire fourth target layer 34(2) but does not penetrate through the entire fifth non-conductive layer 35(1).

Electron image 70 of FIG. 4 includes (a) a first portion 71 that represents the over etching that exposes fifth non-conductive layer 35(1), (b) second portion 72 that represent the fourth target layer 34(2) and, (c) a peripheral region 73 that represents fourth non-conductive layer 34(1).

Figure 5:
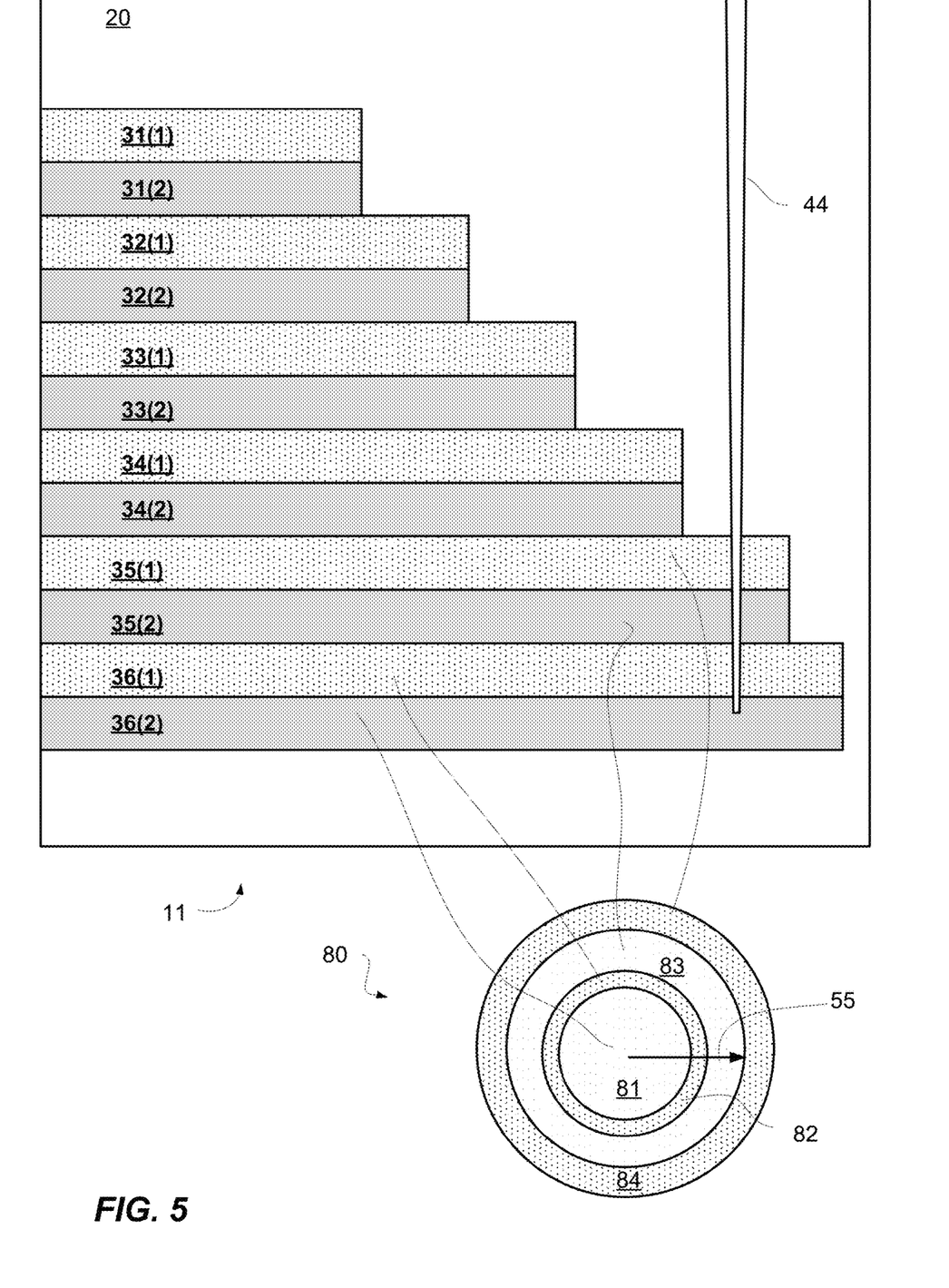
FIG. 5 is an example of a hole formed within a part of an intermediate product.

Fourth hole 44 of FIG. 5 is a second degree over-etched hole. The fourth hole 44 exposes (a) fifth non-conductive layer 35(1) that is located above the fifth target layer and belongs to the fifth set of layers 35, (b) fifth target layer 35(2) which is conductive, (c) sixth non-conductive layer 36(1) that is located below the fifth target layer 35(2) and belongs to the sixth set of layers 36, and (d) sixth conductive layer 36(2) that is located below the sixth non-conductive layer and also belongs to the sixth set of layers 36.

Fourth hole 44 penetrates through the entire fifth target layer 35(2) and also penetrates through the entire sixth non-conductive layer 36(1). If fourth hole 44 is filled with conductive material—the sixth and fifth conductive layers will be shorted.

Electron image 80 of FIG. 5 includes a center 81 (represents sixth conductive layer 36(2)), a first intermediate annular region 82 (represents sixth non-conductive layer 36(1)), second intermediate region 83 (represents fifth conductive layer 35(2)) and a peripheral region 64 that represents fifth non-conductive layer 35(1).

Figure 6:
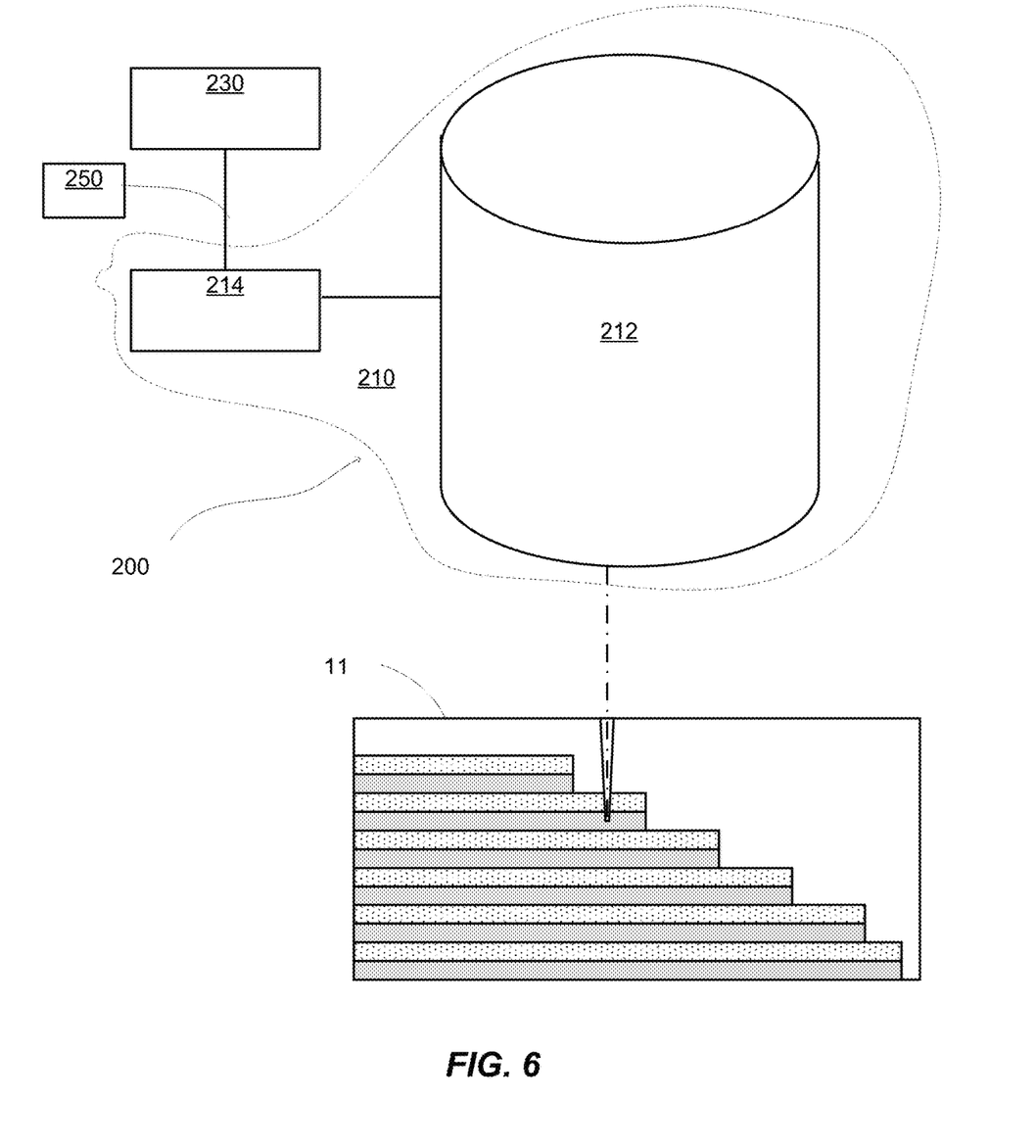
FIG. 6 is an example of an evaluation system and a hole formed within a part of an intermediate product.

FIG. 6 illustrates an example of evaluation system 200 and a part 11 of the intermediate product.

Evaluation system 200 may include imager 210 and processing circuit 220.

The imager 210 may be configured to obtain an electron image (150) of the hole.

Imager 210 may include electron optics 212 configured to scan one or more holes with an electron beam.

Imager 210 may also include a frame grabber 214 or other circuitry that may convert detections signals to electron images in any manner.

Processing circuit 230 is configured to evaluate the intermediate product based on the electron image.

The processing circuit 230 may include one or more integrated circuits and may include one or more field programmable gate arrays, one or more central processing units, one or more graphical processing units, and the like.

The processing circuit 230 may be configured to generate the classifications or may be configured to use classification built by another computerized system.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. An evaluation system, comprising:
    an imager configured to obtain an electron image of a hole that is formed by an etch process and exhibits a high aspect ratio and has a width of a nanometric scale, the hole exposing at least one layer of one or more sets of layers, each set of layers comprises layers that differ from each other by their electron yield and belong to an intermediate product manufactured by one or more manufacturing stages of a manufacturing process of a three dimensional NAND memory unit; and
    a processing circuit configured to evaluate, based on the electron image, whether the hole ended at a target layer of the intermediate product.

2. The evaluation system according to claim 1 wherein the processing circuit is configured to evaluate whether the hole ended at the target layer by performing a classification of the hole to a class out of different classes that represent different possible outcomes of the etch process.

3. The evaluation system of according to claim 2 wherein the processing circuit is configured to perform the classification based on attributes related to at least a part of the electron image.

4. The evaluation system of according to claim 3 wherein the at least a part of the electron image has a radial symmetry.

5. The evaluation system of according to claim 3 wherein the attributes represent image signal properties related to etch process parameters.

6. The evaluation system of according to claim 2 wherein the classes comprise a properly etched hole, an under-etched hole, a first degree over-etched hole; and a second degree over-etched hole, wherein the second degree exceeds the first degree.

7. The evaluation system according to claim 1 wherein an over-etched hole of a first degree exposes a conductive layer of a single set of layers.

8. The evaluation system according to claim 1 wherein an over-etched hole of a second degree exposes conductive layers of sets of layers.

9. A method for evaluating a hole formed by an etch process and that exhibits a high aspect ratio and has a width of a nanometric scale, the method comprising:
    obtaining an electron image of the hole, the hole exposes at least one layer of one or more sets of layers, each set of layers comprises layers that differ from each other by their electron yield and belong to an intermediate product manufactured by one or more manufacturing stages of a manufacturing process of a three dimensional NAND memory unit; and
    evaluating, by an evaluation system, and based on the electron image, whether the hole ended at a target layer of the intermediate product.

10. The method according to claim 9 wherein the evaluating comprises classifying the hole to a class out of different classes that represent different possible outcomes of the etch process.

11. The method according to claim 10 wherein the classifying is based on attributes related to at least a part of the electron image.

12. The method according to claim 11 wherein the at least a part of the electron image has a radial symmetry.

13. The method according to claim 12 wherein the attributes represent image signal properties related to etch process parameters.

14. The method according to claim 10 wherein the classes comprise a properly etched hole, an under-etched hole, a first degree over-etched hole; and a second degree over-etched hole, wherein the second degree exceeds the first degree.

15. The method according to claim 9 wherein an over-etched hole of a first degree exposes a conductive layer of a single set of layers.

16. The method according to claim 9 wherein an over-etched hole of a second degree exposes conductive layers of sets of layers.

17. A non-transitory computer readable medium that stores instructions for obtaining an electron image of a hole formed by an etch process and that exhibits a high aspect ratio and has a width of a nanometric scale, the hole exposing at least one layer of one or more sets of layers, wherein each set of layers comprises layers that differ from each other by their electron yield and belongs to an intermediate product manufactured by one or more manufacturing stages of a manufacturing process of a three dimensional NAND memory unit; and evaluating, by a computerized system and based on the electron image, whether the hole ended at a target layer of the intermediate product.

\* \* \* \* \*